(12) United States Patent
Davidson et al.

(10) Patent No.: US 7,057,884 B2
(45) Date of Patent: Jun. 6, 2006

(54) INSTRUMENT ENCLOSURE APPARATUS

(75) Inventors: Ronald Davidson, West Lothian (GB); David Ravie, West Lothian (GB)

(73) Assignee: Agilent Technologies, Inc., Palo Alto, CA (US)

( * ) Notice: Subject to any disclaimer, the term of this patent is extended or adjusted under 35 U.S.C. 154(b) by 217 days.

(21) Appl. No.: 10/641,782

(22) Filed: Aug. 15, 2003

(65) Prior Publication Data

US 2004/0042192 A1 Mar. 4, 2004

(30) Foreign Application Priority Data

Aug. 28, 2002 (EP) .................................. 02255955

(51) Int. Cl.
*G06F 1/16* (2006.01)
(52) U.S. Cl. ................... 361/679; 361/816; 312/223.2; 312/223.3; 206/207; 206/716; 220/528; 220/529; 220/532
(58) Field of Classification Search ................ 361/679, 361/683, 736, 752, 816, 818; 174/15.1, 16.3, 174/252.1, 35 MS; 312/223.2, 223.3, 236; 360/97.01, 97.02
See application file for complete search history.

(56) References Cited

U.S. PATENT DOCUMENTS

| 4,012,089 | A | * | 3/1977 | Ward ........................... 312/236 |
| 4,261,465 | A | * | 4/1981 | Thomas ....................... 206/708 |
| 5,045,960 | A | | 9/1991 | Eding |
| 5,757,618 | A | | 5/1998 | Lee |
| 6,088,224 | A | | 7/2000 | Gallagher et al. ............ 361/695 |
| 6,285,547 | B1 | | 9/2001 | Vigeant et al. ............... 361/695 |
| 6,428,126 | B1 | | 8/2002 | Poulter et al. ............... 312/263 |
| 6,430,041 | B1 | | 8/2002 | Johnson et al. .............. 361/687 |
| 2003/0147224 | A1 | * | 8/2003 | Chen ............................ 361/752 |

FOREIGN PATENT DOCUMENTS

| DE | 19722893 A1 | 12/1998 |
| EP | 0 174 163 | 6/1986 |

* cited by examiner

*Primary Examiner*—Michael Datskovskiy (57) ABSTRACT

An instrument enclosure apparatus has a housing with a sidewall and a pair of retaining posts disposed within the housing and adjacent the sidewall, the retaining posts in combination with the sidewall defining a pair of opposing channels for slidably receiving a complementarily shaped insert part. Vents may be disposed along the sidewall of the housing, and the insert part assists in providing adaptable air flow management design.

8 Claims, 9 Drawing Sheets

INSTRUMENT ENCLOSURE APPARATUS

TECHNICAL FIELD

The present invention relates, in general, to an instrument enclosure apparatus of a type used for enclosing electronic devices such as computer hardware. In particular, the present invention relates to a clamshell instrument enclosure apparatus.

BACKGROUND ART

An instrument enclosure apparatus typically comprises a number of computer hardware devices such as a motherboard, Printed Circuit Board (PCB), transformer, fan, display panel and processor. The instrument enclosure apparatus protects the hardware from damage that may arise from shock, vibration or external abrasion and provides a convenient package enabling the hardware to be portable and suitable for bench-top use or rack mounting. The instrument enclosure apparatus may also comprise means to shield the hardware from electromagnetic interference (EMI) and electrostatic discharge (ESD) generated by hardware external to the instrument enclosure apparatus and also from the enclosed hardware itself.

A known approach in the manufacture of an instrument enclosure apparatus uses a combination of punched-sheet-steel enclosure parts together with one or more plastic mouldings. The enclosure parts are shaped before assembly of the instrument enclosure apparatus using a suite of hard tools; a manufacturing process known as a 'hard-tooling'. Hard-tooling typically uses a single hit power-press tool designed to produce a fixed configuration of the enclosure parts. In order to achieve some flexibility and therefore enable more than one design to be produced using the enclosure parts, the manufacturing process of the enclosure parts is split into a number of discrete stages, for example: pierce, blank, fold-stage one, fold-stage two. To further increase flexibility, additional movable elements such as punch and die clusters may be used.

The instrument enclosure apparatus is typically designed to provide a cooling regime for the particular configuration of hardware it is to accommodate when manufacture is complete. The cooling regime is necessary in order to prevent damage or inefficient operation of the hardware through overheating. The cooling requirements of a particular instrument enclosure apparatus can be met through the distribution of vents along the sidewalls of the instrument enclosure apparatus and by employing active cooling methods such as a fan within the instrument enclosure apparatus, or by employing passive cooling methods where thermal convection is used to drive air circulation within the instrument enclosure apparatus. Both active and passive cooling methods aim to expel warm air through the vents and replace the warm air with cooler air drawn from the exterior of the instrument enclosure apparatus.

The above manufacturing approach is disadvantageous because such suites of hard tools are expensive and changing the width or length of the instrument enclosure apparatus normally requires a new suite of expensive tools to be designed and used to create the new instrument enclosure apparatus. Furthermore, should a new configuration of hardware be inserted within the instrument enclosure apparatus, the cooling regime designed for the earlier hardware configuration may not be suitable for the new hardware configuration. Following manufacture, the above described instrument enclosure apparatus is not flexible in design due to the fixed configuration of the enclosure parts, and therefore, in order to accommodate a new cooling regime, a new instrument enclosure apparatus is typically manufactured.

Alternatively, an instrument enclosure apparatus such as an injection moulded, plastic clamshell can be manufactured. Such plastic clamshells are normally cheaper to manufacture than the steel instrument enclosure apparatuses mentioned above. A clamshell is a particular design of instrument enclosure apparatus comprising a base portion and a lid portion. An assembly of a clamshell instrument enclosure apparatus comprises insertion of the hardware within the base portion, followed by fixing the lid portion to the base portion to complete the assembly process. Such an assembly process is known in the art as 'top-down' assembly. The disadvantage of present injection moulded clamshell enclosure apparatus is that each particular clamshell instrument enclosure apparatus is designed for a single product and is designed to support a particular cooling regime dependent upon the layout and/or type of hardware it is to accommodate when assembled. Therefore, a change in the configuration of the hardware and a consequent change in the cooling requirements of the clamshell instrument enclosure apparatus requires a replacement enclosure to be designed and manufactured. Known clamshell instrument enclosure apparatus designs are therefore not well suited for reuse or to accommodate a change in the layout and/or type of hardware they comprise during their lifetime.

SUMMARY OF INVENTION

According to a first aspect of the present invention, there is provided an instrument enclosure apparatus comprising: a housing having a sidewall and a pair of retaining posts disposed within the housing and adjacent the sidewall, the retaining posts in combination with the sidewall defining a pair of opposing channels for slidably receiving a complementarily shaped insert part.

The retaining posts may project from the surface of the sidewall and may be arranged to abut the sidewall.

At least one of the retaining posts may be elongate and may comprise a tapered surface complementarily abutting a tapered wall of the insert part.

The retaining posts may be substantially T-shaped in cross-section. The retaining posts may be integrally formed with the sidewall.

The housing may have at least three retaining posts, each adjacent pairing of retaining posts in combination with the sidewall defining a respective pair of opposing channels, disposed at spaced locations along the sidewall.

The insert part may be any of an airflow control device, a utility bracket and a motherboard retainer.

At least part of the inner surface of the housing may be metallised.

According to a second aspect of the present invention, there is provided an insert part for an instrument enclosure apparatus, comprising: a body shaped to permit performance of a predetermined function; and a peripheral shoulder arranged to be slidably insertable into a complementarily shaped channel.

The peripheral shoulder may be defined by a tapered wall.

In one embodiment, there is provided an instrument enclosure apparatus insert part comprising the insert part as set forth above in relation to the second aspect of the present invention.

According to a third aspect of the present invention, there is provided a shield for grounding EMI, the shield including a peripheral protrusion, the protrusion being trappable against an electrically conductive part of a housing for accommodating the shield.

The housing may have a channel, the channel having a metallised or metallic surface, the protrusion being trapped, when in use, against the metallised or metallic surface. The protrusion may be trapped, when in use, between a part for which the shield is to provide EMI shielding located within the channel and the metallised or metallic surface.

According to a fourth aspect of the present invention, there is provided a housing for an electrical part, the housing comprising a guiding slot having an opening and outlining a substantially wedge-shaped volume, the slot permitting slidable insertion of an edge of the electrical part into the opening of the guiding slot, the guiding slot tapering from the opening to a channel narrower than the opening. The slot may widen at the ends thereof for permitting slidable insertion of the edge of the electrical part.

The edge of the electrical part may be profiled to complement the taper of the guiding slot, the electrical part sitting, when in use, snugly within the guiding slot. The electrical part may comprise a shield for EMI shielding, a part of the shield being trapped between the electrical part and a wall of the guiding slot.

BRIEF DESCRIPTION OF DRAWINGS

At least one embodiment of the present invention will now be described, by way of example only, with reference to the accompanying drawings, in which.

DETAILED DESCRIPTION OF THE DRAWINGS

Throughout the following description, identical reference numerals will be used to identify like parts.

Figure 1:
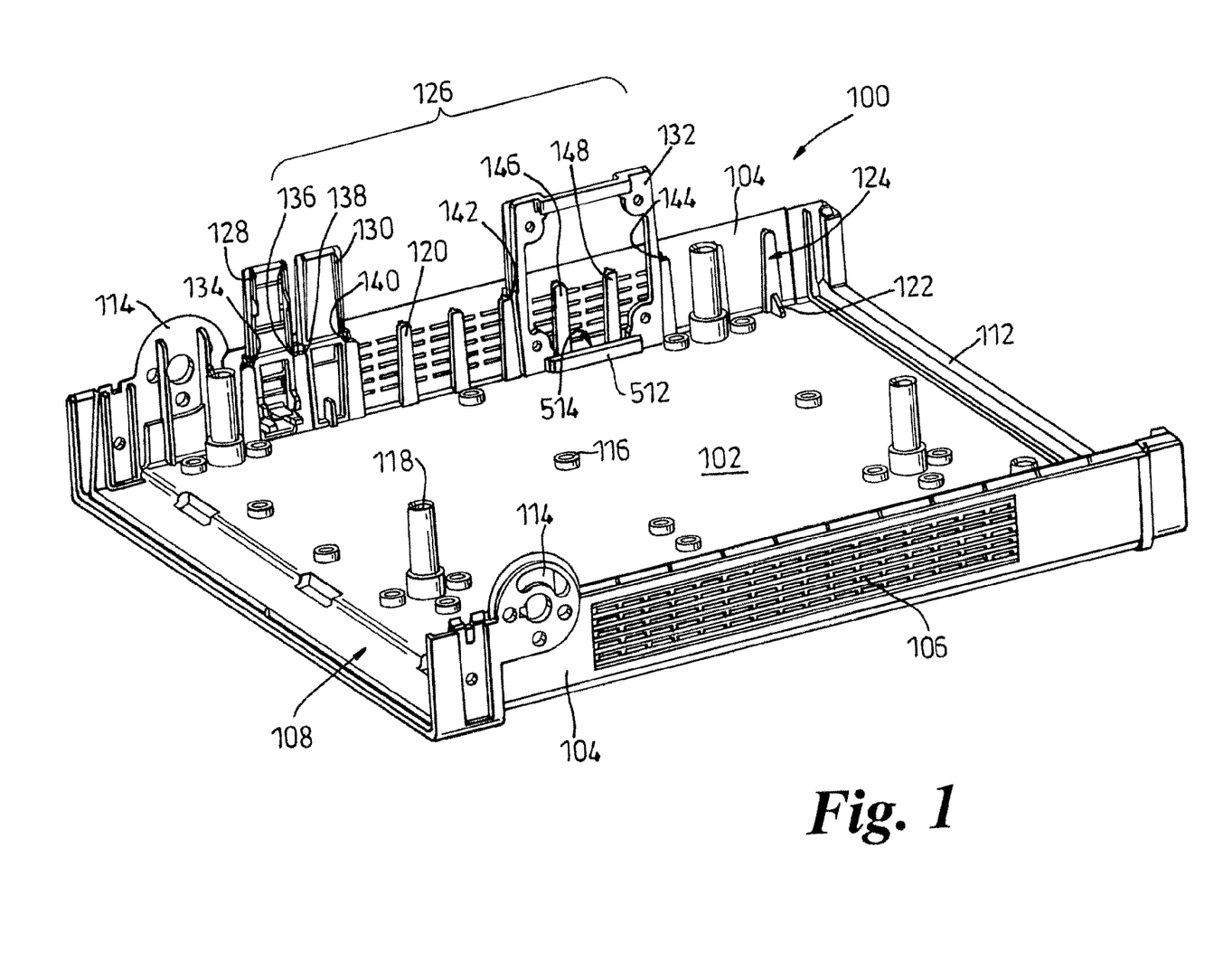
FIG. 1 is a schematic diagram of a base portion of a clamshell instrument enclosure apparatus constituting a first embodiment of the present invention.

Referring to FIG. 1, an injection-moulded base portion 100 of a clamshell instrument enclosure apparatus (clamshell) comprises a base 102 and a pair of sidewalls 104 extending substantially perpendicular from the base 102, each sidewall 104 having a plurality of vents 106 disposed therealong. The base portion 100 comprises a front portion 108 for accommodating a display assembly 110 (described in more detail in FIGS. 7 to 11) and a rear portion 112 for accommodating, for example, data signal and power connections between electronic hardware devices arranged within the clamshell (not shown in FIG. 1) and those external to the clamshell. The base portion 100 also comprises a handle connector attachment arrangement 114 for coupling a handle (not shown), for example a bail handle, thereto. When connected, the handle can assume a first position for carrying of the clamshell, and a second position to provide a tilt stand for the clamshell. A plurality of bosses 116, each comprising subsequently inserted respective internally threaded metal inserts, and a plurality of alignment features 118 are integrally formed with the base 102. The surface of the base 102 comprises a conductive, metallised, coating in order to achieve a typical sheet resistance of less than 0.05 Ohms. The conductive metallised coating can be provided in a number of ways, including spray painting paint loaded with conductive particles, for example silver, graphite or nickel. Alternatively, a thin metal layer can be deposited using known vacuum coating metallisation processes. The metallisation of the surface of the base 102 also serves to provide the base 102 with Electro-Static Discharge (ESD) properties. It should be appreciated that other techniques for making the base 102 electrically conductive, at least on the interior surface, can be employed. For example, stainless steel filaments can be added to the plastic moulding compound used to form the base 102 prior to injection moulding of the base 102. Also, a combination of the above described techniques is also conceivable.

A plurality of retaining posts 120 are integrally formed with the base 102 and extend therefrom along the sides of the base 102 and stand substantially perpendicular to the base 102. In this example, but not all, the retaining posts 120 are disposed at regular intervals along the sides of the base 102 adjacent the sidewalls 104.

Figure 2A:
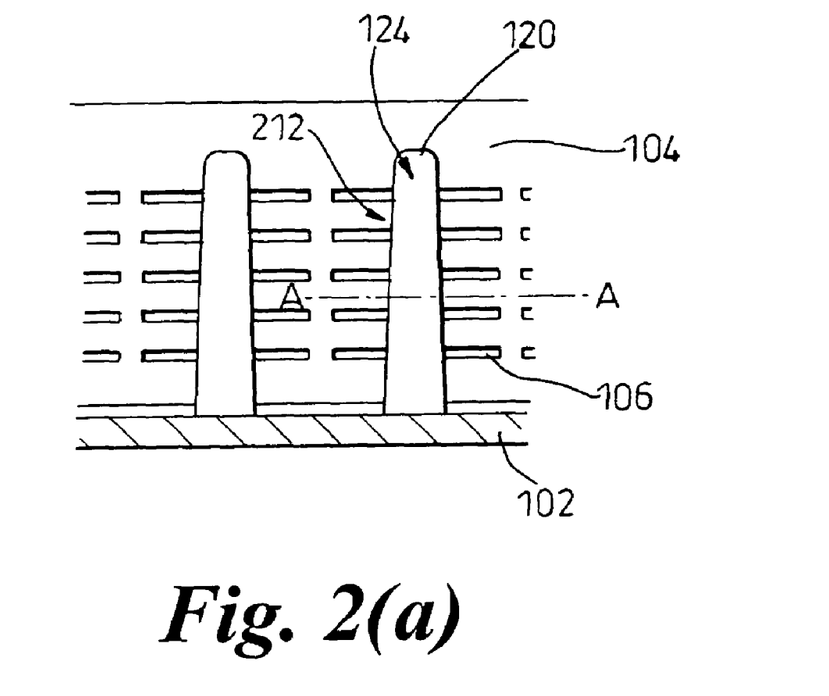
FIGS. 2(a) and (b) are schematic front and plan and plan views, respectively, of a securing member of FIG. 1.
Figure 2B:
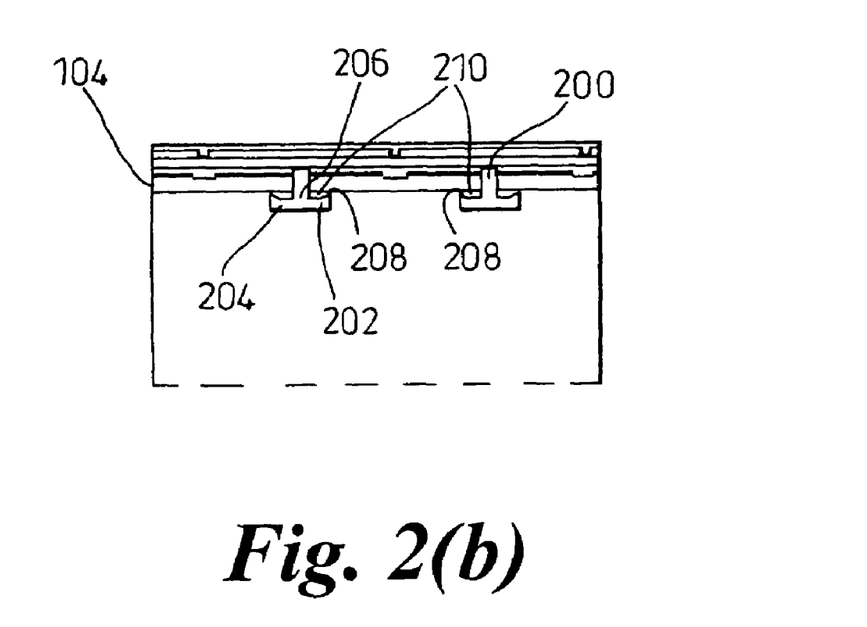

Referring to FIGS. 2(a) and (b), the cross-section of the retaining posts 120 along the line A—A is substantially T-shaped (FIG. 2(b)). Consequently, in cross-section along the line A—A, each retaining post 120 has a stem 200, a first branch 202 and a second branch 204 that meet at an end 206 of the stem 200. The stem 200 extends away from the first and second branches 202, 204 to one of the sidewalls 104 to which the retaining post 120 is adjacent. Each of the first and second branches 202, 204 extend away from the end 206 of the stem 200 initially with substantially uniform thickness, but thickening towards the ends of the first and second branches 202, 204 distal from the end 206 of the stem 200 so as to provide respective inward projections 208 towards one of the sidewalls 104 to which the retaining post 120 is adjacent. In side elevation (FIG. 2(a)), each retaining post 120 has an elongate profile that tapers due to a surface 212 that tapers outwardly from the top of each retaining post 120 to the base 102. Although not shown in FIGS. 2(a) and (b), it can be seen from FIG. 1 that a supporting tab 122 communicates between the base 102 and a lower portion of a side 124 of the retaining post 120 in order to reinforce the retaining post 120.

Consequently, for a given retaining post 120, a channel 210 is defined by one of the sidewalls 104, the stem 200 and the first or second branch 202, 204. Any two opposing channels 210 can be used to accommodate a suitably shaped insert device (or part) 126 (FIG. 1).

It should be appreciated that whilst the retaining post 120, as described above, has a T-shaped cross-section along the line A—A, the retaining post 120 can be formed so as to possess other cross-sectional shapes.

Referring back to FIG. 1, and as mentioned above, the insert device 126 can be secured between pairs of the retaining posts 120, and are shaped according to the function to be provided by the insert device 126. For example, the insert device 126 can be a motherboard retainer 128, an air flow control device such as a vent block 130, or a utility bracket 132 described in more detail in FIGS. 3, 4 and 5, respectively.

Figure 3:
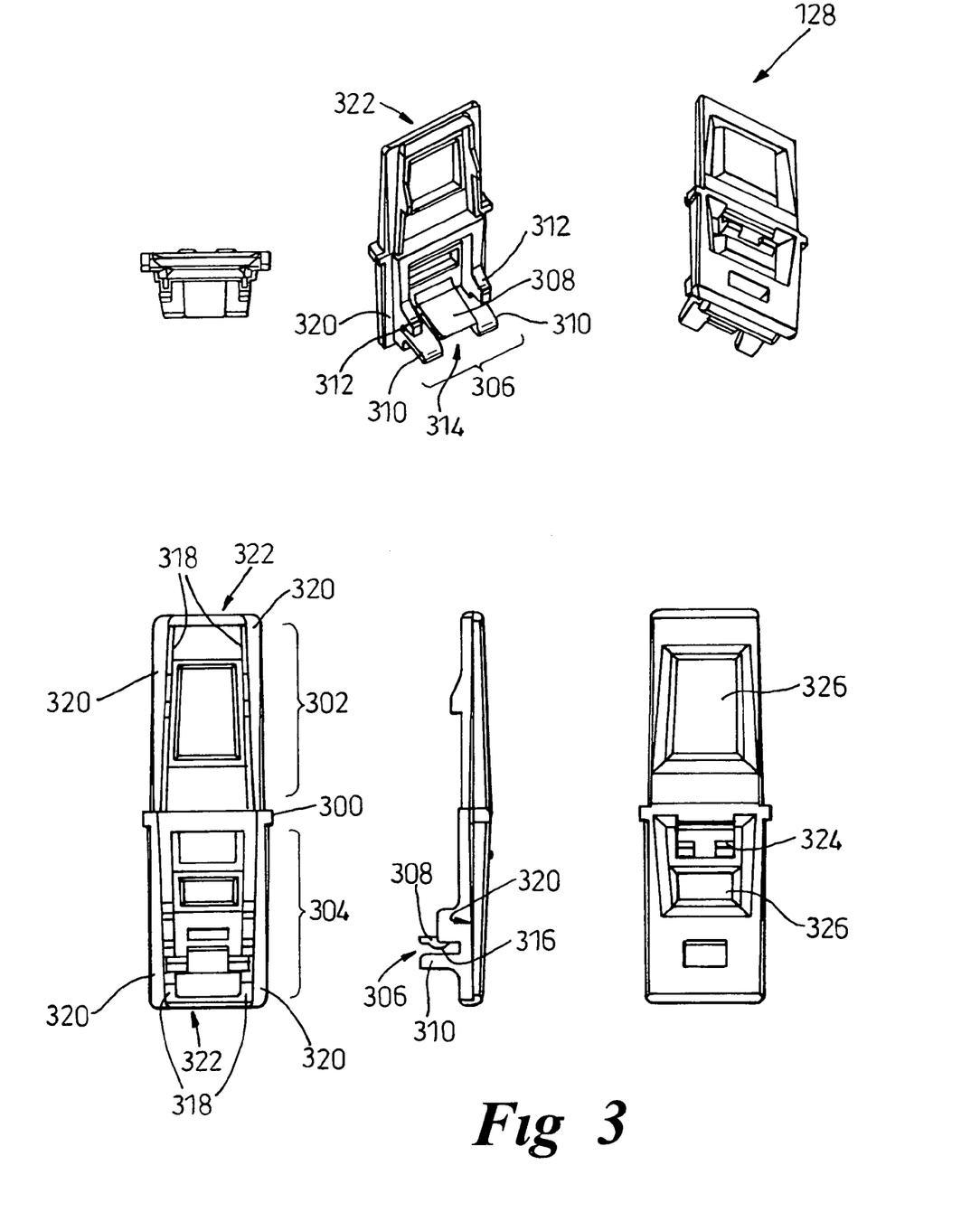
FIG. 3 is a variety of schematic views of a motherboard retainer of FIG. 1.

Referring to FIG. 3, the motherboard retainer 128 comprises a retainer body 300 which is substantially rectangular in outline and has an upper portion 302 and a lower portion 304. A clip portion 306 is integrally formed with the lower portion 304 of the retainer body 300 and is arranged to receive and engage an outer edge of a printed circuit board (not shown), for example, a motherboard. In this respect, the clip portion 306 comprises an upper tab 308 longitudinally spaced, with respect to the retainer body 300, above a pair of separated lower supporting protrusions 310, and between a pair of separated upper supporting protrusions 312, a slot being defined by the lower and upper supporting protrusions 310,312 to hold the outer edge of the printed circuit board mentioned above. The upper tab 308 is therefore located, in lateral terms, substantially above a separating space 314 between the pair of separated lower supporting protrusions 310. The upper tab 308 comprises a retaining convexity 316 for engaging a routed section (not shown) that can be provided along the outer edge of the printed circuit board. The upper tab 308 is resiliently deformable so that upon insertion of the outer edge of the printed circuit board into the clip portion 306, a snap fit is created between the outer edge of the printed circuit board and the clip portion 306. When installing the printed circuit board within the clamshell, tubular spacers (not shown) attached to the printed circuit board are aligned with respective bosses 116 and screws (not shown) respectively pass through the spacers to fix the printed circuit board to the electrically conductive base 102 by way of the bosses 116 in order to provide grounding for the printed circuit board. However, in-set peripheral walls 318 projecting perpendicular to the rectangular outline of the retainer body 300 define an inner peripheral shoulder 320 to co-operate with a first pair of channels 134,136 (FIG. 1). The peripheral walls 320 taper inwardly from the centre of the retainer body 300 to longitudinal ends 322, i.e. the tapered profile of the peripheral walls 320 have a widest extent at approximately the junction of the upper portion 302 and lower portion 304. The motherboard retainer 128 also comprises a snap catch 324 projecting outwardly from an opposite side of the retainer body 300 to that from which the clip portion 306 extends, the snap catch 324 being insertable into a vent 106 in order to secure the motherboard retainer 128 in position. The motherboard retainer 128 is formed so as to comprise apertures 326 to permit, when installed, some flow of air through the vents 106 adjacent the motherboard retainer 128 into the interior of the clamshell.

Figure 4:
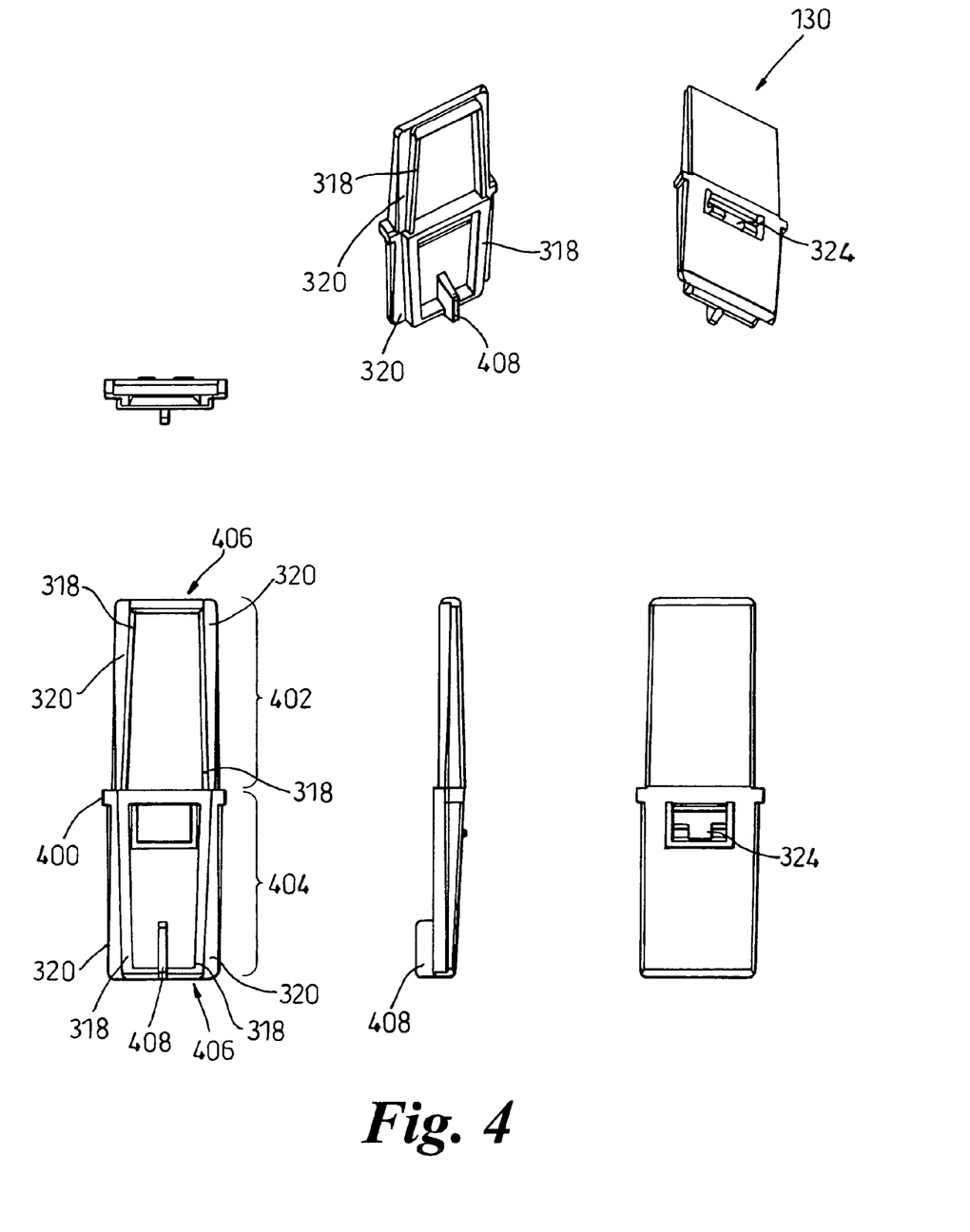
FIG. 4 is a variety of schematic views a vent block of FIG. 1.

Referring to FIG. 4, the vent block 130 comprises a vent block body 400 having a first portion 402 and a second portion 404. In common with the motherboard retainer 128, the vent block 130 has a substantially rectangular outline and in-set peripheral walls 318 that define an inner peripheral shoulder 320 for co-operating with a second pair of channels 130,140 (FIG. 1). The peripheral walls 318 taper inwardly from the longitudinal centre of the vent block 130 to longitudinal ends 406 of the vent block 130, i.e. the tapered profile of the peripheral walls 318 have a widest extent at the junction of the first portion 402 and the second portion 404. A wall portion 408 is integrally formed with the vent block 130 at one of the longitudinal ends 406 and extends into, or above, a level corresponding to the slot defined by the lower and upper supporting protrusions 310, 312 in order to provide a fool-proofing feature that prevents vents being unintentionally blocked by the vent block 130. In this respect, the printed circuit board comprises clearance slots (not shown) disposed at predetermined locations about the periphery of the printed circuit board. Where a clearance slot exists, the wall portion can pass through the clearance slot and so the vent block can be fully inserted between a pair of corresponding retaining posts. Hence vent blocks 130 can only be inserted adjacent clearance slots. The vent block 130 also comprises a snap catch 324 of the form described above in relation to the motherboard retainer 128. If desired holes (not shown) may be provided in the first portion 402 of the vent block 130 to receive fixing screws for securing a hinge to the vent block. This hinge may in turn be used for securing sub-assemblies, panels and other modules within the clamshell, thereby enabling them to be raised from a normally-stowed position to facilitate access to their underside and to items positioned beneath them.

Figure 5:
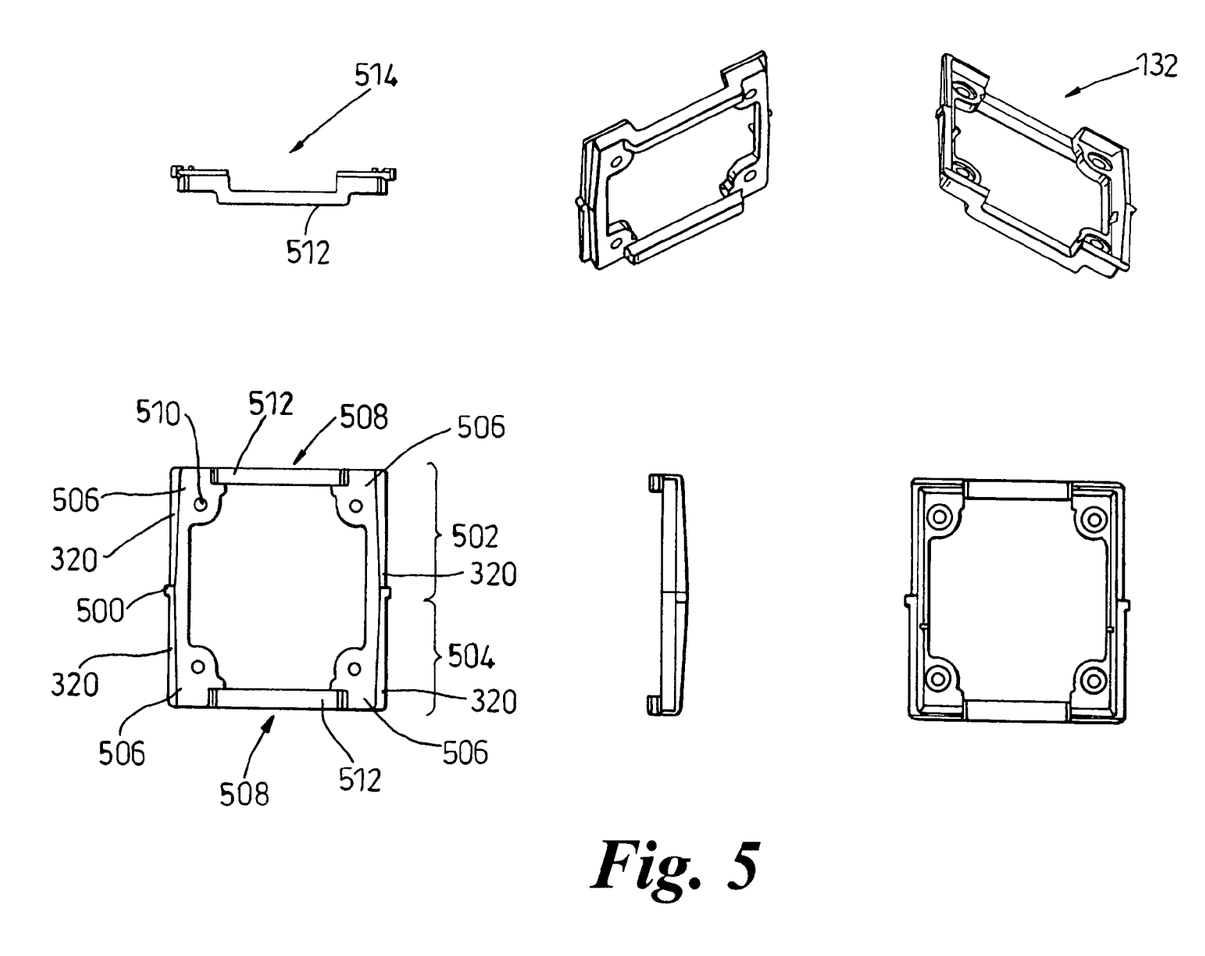
FIG. 5 is a variety of schematic views of a utility bracket of FIG. 1.

Referring to FIG. 5, the utility bracket 132 comprises a utility bracket body 500 having a first portion 502 and a second portion 504. In common with the motherboard retainer 128 and the vent block 130, the utility bracket 132 has a substantially rectangular outline, in this example a substantially square outline, and in-set sidewalls 506 that define a side-shoulder 320 for co-operating with a third pair of channels 142,144. The in-set sidewalls 506 taper inwardly from the centre of the utility bracket where the first and second portions 502,504 meet to ends 508 of the utility bracket 132, i.e. the tapered profile of the in-set sidewalls 506 have a widest extent at the junction of the first portion 502 and second portion 504. The utility bracket 132 further comprises circular corner apertures 510 to accommodate securing means, such as screws (not shown), in order to couple a device such as a fan (not shown) or a transformer (not shown) to the utility bracket 132. The utility bracket 132 also comprises one or more bridge portion 512 that respectively bridge the in-set sidewalls 506 and project beyond and perpendicular to the in-set sidewalls 506 so as to join the in-set sidewalls 506 whilst providing a clearance 514 between the in-set sidewalls 506. Referring back to FIG. 1, the clearance 514 is necessary in order for the utility bracket 132 to straddle one or more intermediate retaining posts 146,148 disposed between the third pair of channels 142,144 within which the side-shoulders 320 of the utility bracket 132 co-operatively lie. If required, the bridge portion 512 can be made a feature of the motherboard retainer 128, or the vent block 130, if their dimensions are increased so as to necessitate straddling one or more retaining post 120.

Figure 6:
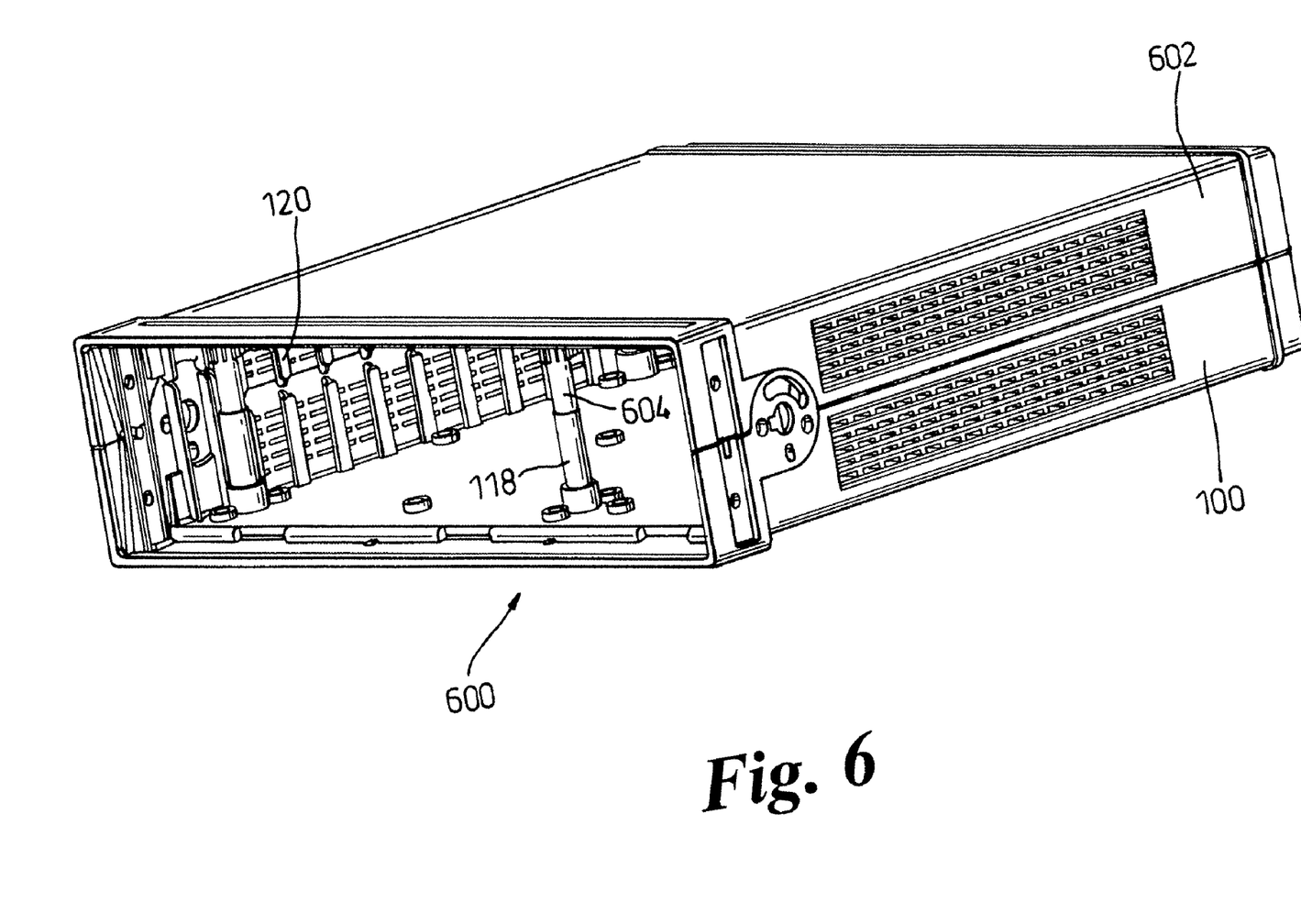
FIG. 6 is a schematic diagram of a partially assembled clamshell instrument enclosure apparatus.

Referring to FIG. 6, a partially assembled clamshell instrument enclosure apparatus 600 comprises the base portion 100 coupled to a lid portion 602. The alignment feature 118 of the base portion 100 is coupled to a corresponding alignment feature 604 integrally formed with the lid portion 602 in order to facilitate efficient mating of the base portion 100 with the lid portion 602. The lid portion 602 also comprises the retaining posts 120 already described above.

The clamshell instrument enclosure apparatus 600 can be used to accommodate differing configurations of hardware and also to provide differing cooling regimes during its lifetime because the insert devices 126 can be positioned between a number of different channels 210 and hence, in this example, in a variety of different locations along the sidewalls 104 of the clamshell. For example, a fan (not shown) can be attached to the utility bracket 132 in order to expel warm air through the vents 106 behind it and to replace the expelled warm air with cooler air drawn through the vents 106 in the opposite sidewall. The position of the fan can be altered easily by relocating the position of the utility bracket 132. Should an alternative configuration of hardware be employed within the clamshell requiring passive as opposed to active cooling, the utility bracket 132 and fan can be replaced by a number of vent blocks 130 distributed according to the required air management design for the electrical equipment to be accommodated within the clamshell 600.

Figure 7:
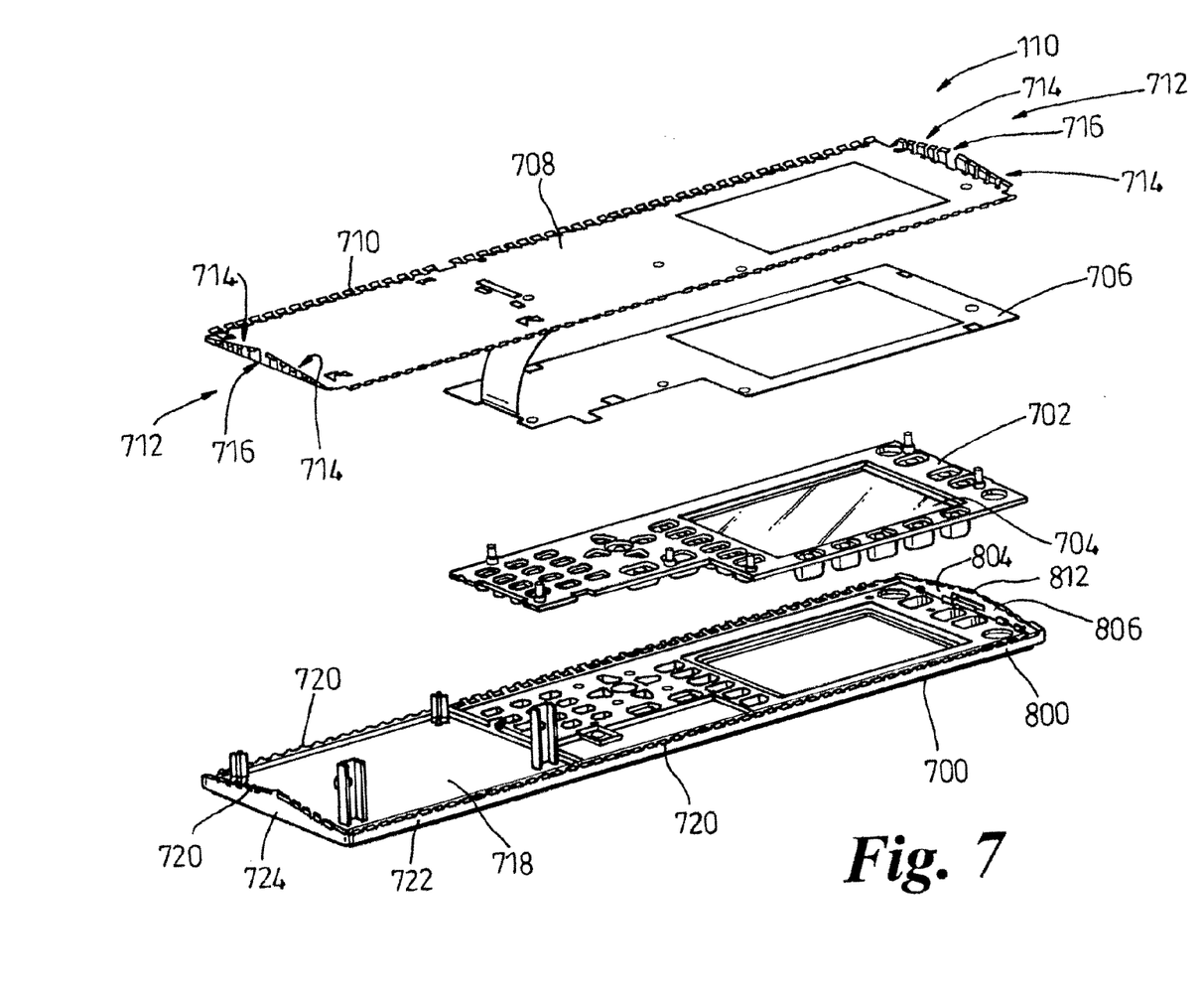
FIG. 7 is an exploded view of a front panel display assembly constituting a second embodiment of the present invention.

Referring to FIG. 7, the front panel display assembly 110 comprises component parts such as a dress panel 700 manufactured from polycarbonate acrylonitrile-butadiene-styrene (PC-ABS), a key mat 702 manufactured from a silicon rubber having a window 704 manufactured from cast polyester with a fine stainless-steel mesh inserted therein, a flex key circuit 706 and an electromagnetic interference (EMI) shield 708 manufactured from stainless steel and having a plurality of hook-shaped finger contacts 710 or 'hooks' extending, or projecting, from and disposed along an outer periphery of the EMI shield 708. In this example, the EMI shield 708 is rectangular in shape, the hooks at opposite ends 712 of the EMI shield 708 defining a sloping profile perpendicular to a plane in which the EMI shield 708 lies. At each of the opposite ends 712, a pair of slopes 714 are defined by the hooks 710, the hooks 710 substantially meeting at a substantially central apex 716.

Figure 8:
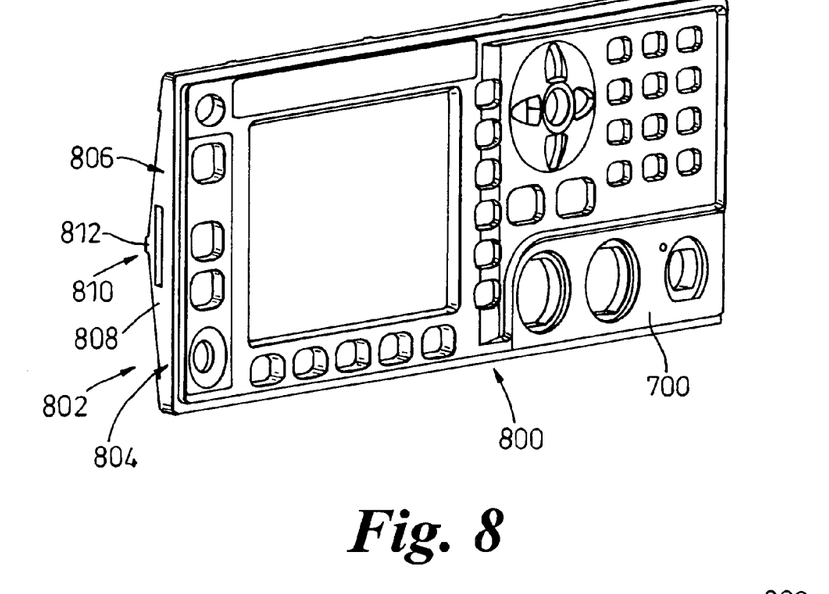
FIG. 8 is a schematic diagram of a dress panel of FIG. 7.

As best shown in FIG. 8, the dress panel 700 comprises a peripheral perpendicular wall 800 projecting away from the dress panel 700. At a first end 802 of the dress panel 700, the peripheral wall 800 comprises a first end wall 804 having a first slope 806 and a second slope 808, the first and second slopes 806,808 slope away from each other from a substantially central apex 810; a narrow ridge 812 is located at the apex 810. The end-wall 804 of the dress panel 700 is complementary to the sloping profile defined by the hooks 710 at one of the opposite ends 712 of the EMI shield 708. Referring back to FIG. 7, the peripheral wall 800 of the dress panel 700 also comprises an array of recesses 720 shaped to receive individually the hooks 710 in a co-operative and complementary manner.

Although only part of the dress panel 700 in FIG. 8 is shown, it should be appreciated that, with reference to FIG. 7, the dress panel 700 also comprises a further peripheral wall 722 that extends the peripheral wall 800 of the dress panel 700, the further peripheral wall 722 including a second endwall 724 having a profile identical, or similar, to the first endwall 804, the second end-wall 724 also being complementary in profile to the profile defined by the hooks 710 at a corresponding end 712 of the EMI shield 708.

Assembly of the front panel display assembly 110 of FIG. 7 is as follows. The key mat 702 is inserted into the dress panel 700 from the back of the dress panel 700, followed by the window 704 and then the flex circuit 706. The EMI shield 708 is then placed over the flex circuit 706 and the exposed part of the dress panel 700 so that the hooks 710 of the EMI shield 708 co-operate with the corresponding recesses 720 disposed around the periphery of the dress panel 700. The EMI shield 708 provides mechanical support to the flex circuit 706 and key mat 702 when keys are pressed by a user when the front panel display assembly is assembled.

Figure 9:
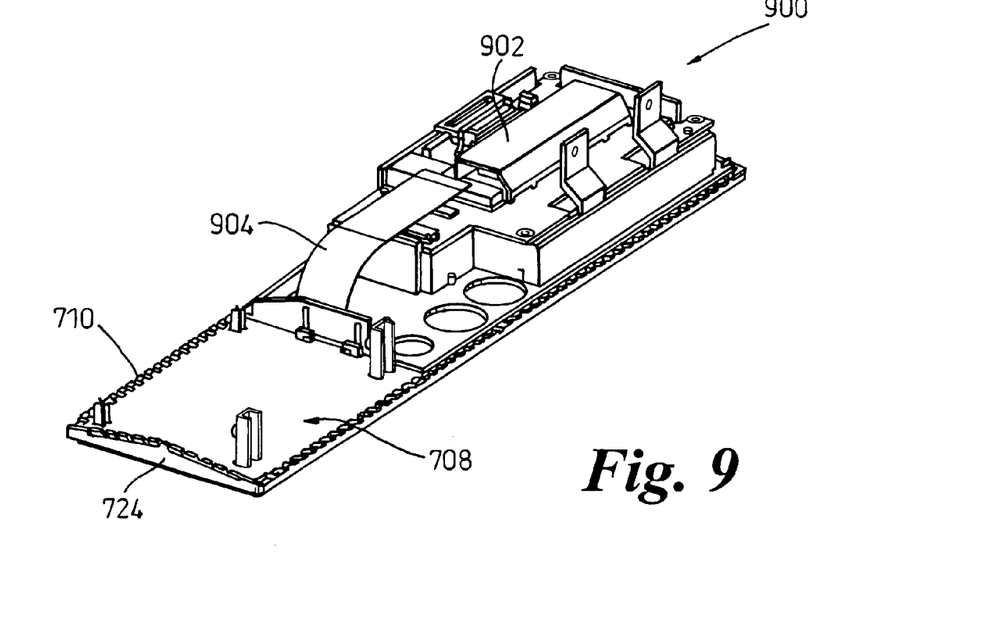
FIG. 9 is a schematic diagram of an assembled front panel display assembly of FIG. 7.

Referring to FIG. 9, an assembled front panel display assembly 900 comprises a display support assembly 902 coupled behind the EMI shield 708 and electrically connected to the flex circuit 706 by way of a flexible planar-like connecting lead 904. The display support assembly 900 snaps into place over the dress panel 700 and secures the EMI shield 708 in position. The display support assembly 900 comprises hardware (not shown) such as a display, a Display Interface Board (D.I.B) and an inverter board that drives a backlight of the display.

The hooks 710 of the EMI shield 708 sit in the corresponding recesses 718 formed in the peripheral wall 800 of the dress panel 700, the height, h, of the side wall being increased due to the additional thickness of the hooks 710 lying within the corresponding recesses.

Figure 10:
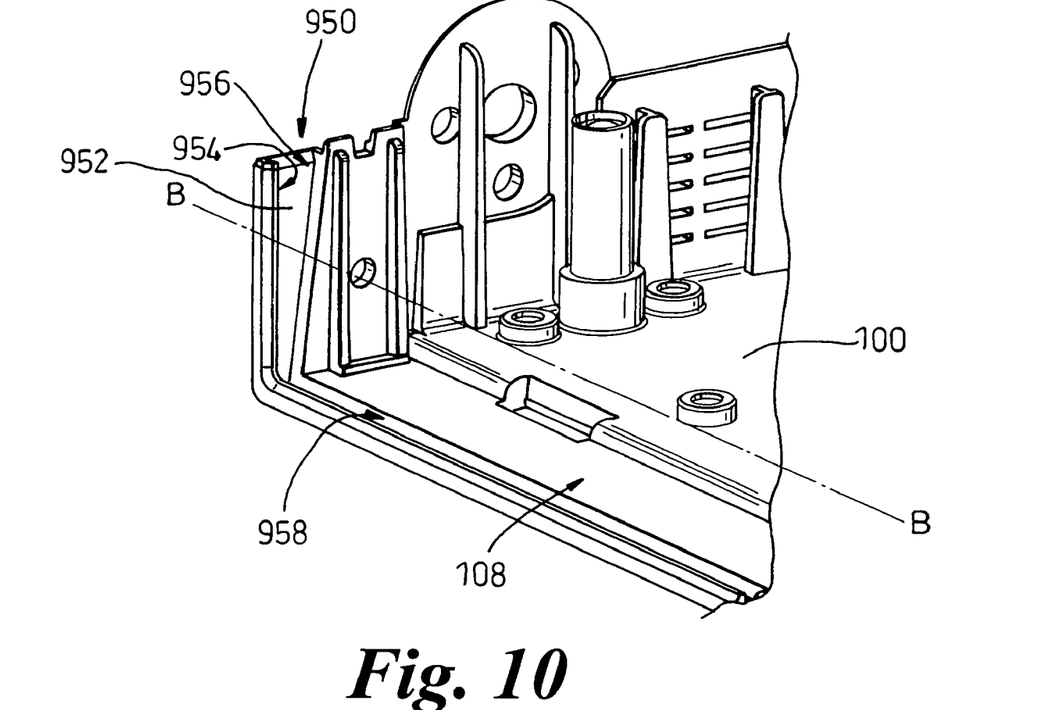
FIG. 10 is a schematic diagram of a front portion of the clamshell instrument enclosure apparatus of FIG. 1.

Referring to FIG. 10, the front portion 108 of the clamshell base portion 100 comprises a guiding slot 950 of tapering width complementary to the tapered profile of one of the first or second slopes 806,808 of the first and second end-walls 804,724. In this respect, the slot 950 of the base portion 100 comprises a channel 952 formed in each of the sidewalls 104 and having a front wall 954 that is substantially perpendicular to the base 102 and a rear wall 956 separated from the front wall 952 by a tapering width corresponding substantially to the height of the apex 810. The rear wall 954 tapers inwardly towards the front wall 954 and the base 102. At the base 102, the tapering channel 952 communicates with a base channel 958 of substantially uniform width corresponding to one or both of the non-tapering sides of the peripheral wall 800. The assembled front panel display assembly 900 is inserted onto the slot 950 which is shaped to receive the assembled front panel display assembly 900 at the front portion 108. The additional height acquired by the peripheral wall 800 from the hooks 710 serves to establish a compression fitting between the assembled front panel display assembly 900 and the clamshell, insertion of the peripheral wall 800 carrying the hooks 710 into the slot 950 urge the hooks 710 into their corresponding recesses 718, and provides sufficient additional thickness to ensure the front panel display assembly 900 is retained in the slot by friction.

Figure 11:
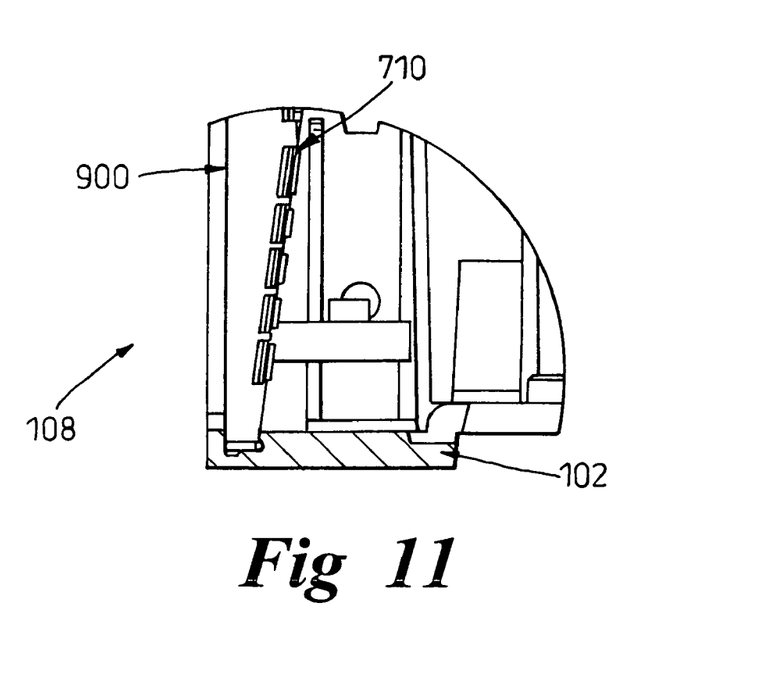
FIG. 11 is a cross-sectional view along the line B—B in FIG. 10 of a front panel display assembly mounted within the clamshell instrument enclosure apparatus constituting a third embodiment of the present invention.

Referring to FIG. 11, in cross-sections along line B—B of FIG. 10, when the assembled front panel display assembly 900 is inserted within the slot 950, the hooks 710 of the EMI shield 708 which surround the edge of the dress panel 700 form an electrical contact with the (metallised) interior of the base 102, thus providing means for EMI grounding. The EMI shield 708 therefore provides structural support for the front panel display assembly 900 and also electrical contact between the EMI shield 708 of the front panel assembly 900 and the interior chassis of the clamshell, by virtue of the hooks 710, to provide continuous grounding of EMI.

The invention claimed is:

1. A configurable instrument enclosure apparatus comprising:
 a housing having a sidewall and a pair of retaining posts disposed within the housing and adjacent the sidewall, the retaining posts in combination with the sidewall defining a pair of opposing channels for slidably receiving at least one of a plurality of different complementarily shaped insert parts.

2. An apparatus as claimed in claim 1, wherein the retaining posts are arranged to abut the sidewall.

3. An apparatus as claimed in claim 1, wherein at least one of the retaining posts is elongate and comprises a tapered surface complementarily abutting a tapered wall of the insert part.

4. An apparatus as claimed in claim 1, wherein the retaining posts are substantially T-shaped in cross-section.

5. An apparatus as claimed in claim 1, wherein the retaining posts are integrally formed with the sidewall.

6. An apparatus as claimed in claim 1, wherein the housing has at least three retaining posts, each adjacent pairing of retaining posts in combination with the sidewall defining a respective pair of opposing channels, disposed at spaced locations along the sidewall.

7. An apparatus as claimed in claim 1, wherein the insert part is any of an airflow control device, a utility bracket and a motherboard retainer.

8. An apparatus as claimed in claim 1, wherein at least part of the inner surface of the housing is metallised.

* * * * *